US007213042B2

United States Patent
Cannon

(10) Patent No.: US 7,213,042 B2
(45) Date of Patent: May 1, 2007

(54) DIGITAL IF PROCESSING BLOCK HAVING FINITE IMPULSE RESPONSE (FIR) DECIMATION STAGES

(75) Inventor: Richard Hollingsworth Cannon, Mesa, AZ (US)

(73) Assignee: Comtech EF Data, Inc., Tempe, AZ (US)

( * ) Notice: Subject to any disclaimer, the term of this patent is extended or adjusted under 35 U.S.C. 154(b) by 0 days.

(21) Appl. No.: 11/247,302

(22) Filed: Oct. 11, 2005

(65) Prior Publication Data
US 2006/0031275 A1   Feb. 9, 2006

(51) Int. Cl.
*G06F 17/10*   (2006.01)
(52) U.S. Cl. ...................................... 708/300
(58) Field of Classification Search ................. 708/300
See application file for complete search history.

(56) References Cited

U.S. PATENT DOCUMENTS

| | | | | |
|---|---|---|---|---|
| 5,079,734 A | * | 1/1992 | Riley | 708/313 |
| 5,437,281 A | * | 8/1995 | Lin et al. | 600/443 |
| 5,511,099 A | * | 4/1996 | Ko et al. | 375/368 |
| 5,880,687 A | * | 3/1999 | May et al. | 341/61 |
| 6,279,019 B1 | * | 8/2001 | Oh et al. | 708/300 |
| 6,470,365 B1 | * | 10/2002 | Rahman et al. | 708/313 |
| 2004/0107078 A1 | * | 6/2004 | Chiu et al. | 703/2 |

* cited by examiner

*Primary Examiner*—Tan V. Mai
(74) *Attorney, Agent, or Firm*—Jeffrey D. Moy; Weiss & Moy, P.C.

(57) ABSTRACT

A digital Intermediate Frequency (IF) processing block including a decimation filter having Finite Impulse Response (FIR) decimation stages provides improved performance over a Hogenauer decimating filter. The filter comprises multiple integrator stages followed by multiple FIR decimating stages. The zeros of the filter are tunable by adjusting the integer coefficients of the FIR stages providing tunability of the cut-off response, as opposed to the fixed sinc response of the Hogenauer filter. As a result, the number of required stages for a particular steepness is reduced, dramatically reducing the amount of digital circuitry required to implement a particular filter design. The improved filter is especially suitable for use in digital IF stages in receivers, and for code-based applications where selectable decimation rate is desired and a fast multiply is not available.

13 Claims, 5 Drawing Sheets

DIGITAL IF PROCESSING BLOCK HAVING FINITE IMPULSE RESPONSE (FIR) DECIMATION STAGES

BACKGROUND OF THE INVENTION

1. Field of the Invention

The present invention relates generally to digital filters, and more specifically, to digital decimation filters used in high-frequency applications.

2. Background of the Invention

Digital filters have replaced traditional analog filters in many applications. Predictability/repeatability and high-order slope implementations have made digital filters preferable to analog filters for both low-frequency and high-frequency applications. In particular, high-frequency digital filters are increasingly used in the intermediate frequency (IF) stages of radio communications equipment, wireless networking equipment and other radio-frequency (RF) applications. Various topologies have been used and proposed for use within IF stages of receivers, and decimating filters are particularly applicable to IF receivers as the required clocking rate of each successive stage may be reduced, resulting in a more economical solution.

In particular, a topology known as a Hogenauer Filter (as described by Eugene B. Hogenauer in "An Economical Class of Digital Filters for Decimation and Interpolation" published in the Institute of Electrical and Electronics Engineers (IEEE) Transactions on Acoustics Speech and Signal Processing (ASSP) April 1981, is desirable for use in receiver digital IF stages. The Hogenauer filter provides advantages in via a simple structure that lends itself to high-speed implementation, the decimation ratio is inherently scaled to the filter bandwidth and that the resources required are independent of the decimation ratio.

However, Hogenauer filters have several disadvantages. First, the DC gain of such a filter is $k^N$ where k is the decimation factor and N is the number of filter stages. So, as the decimation or length of the filter is increased, the DC gain must be compensated by lengthening the integrator. Second, the frequency domain transfer function approximates a sinc function: $(\sin \pi f / \pi f)^N$, which is not a particularly steep cut-off response for a given order of filter. Therefore, many filter stages are typically used in cascade to attain a particular level of stopband attenuation and rejection slope. Further, in the Hogenauer filter, the zeros of the filter are located at integer multiples of the decimated output rate (frequency). Therefore, once the filter order is determined, the rejection slope and ultimate stopband attenuation is set.

Therefore, it would be desirable to provide an improved digital decimation filter having improved rejection characteristics without greatly increasing the complexity of the filter. It would further be desirable to provide a digital decimation filter having positionable zeros, whereby the steepness of the cut-off response may be optimized for particular applications. It would further be desirable to provide an improved digital decimation filter having a selectable decimation rate.

SUMMARY OF THE INVENTION

The above objective of providing an improved digital decimation filter is achieved in an IF processing block including a digital filter circuit and method. The digital filter circuit includes a plurality of integrators followed by a plurality of decimating FIR filter stages. The digital filter circuit may include a final equalization FIR filter stage that compensates for the sampling response, permitting the filter cut-off response to be optimized independent of the sampling response.

The apparatus may be embodied in a receiver having a digital IF filter, and may be implemented in an application-specific integrated circuit (ASIC), a field-programmable gate array (FPGA) or other suitable integrated circuit technology. The filter may also be implemented by program instructions performing steps in accordance with the method of the present invention for execution within a digital signal processor (DSP) or within a general-purpose microprocessor.

The foregoing and other objectives, features, and advantages of the invention will be apparent from the following, more particular, description of the preferred embodiment of the invention, as illustrated in the accompanying drawings.

DETAILED DESCRIPTION OF THE EMBODIMENTS

Figure 1:
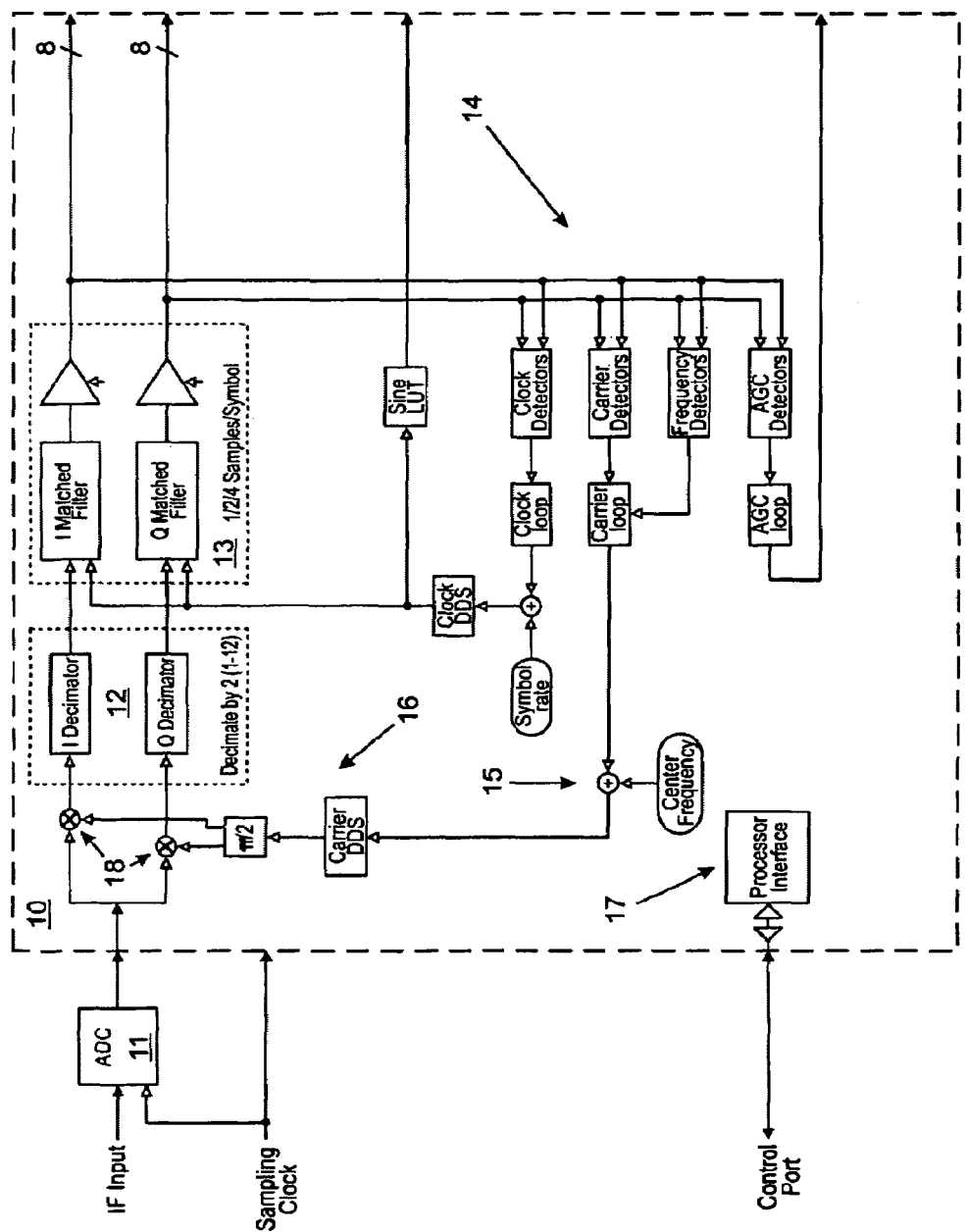
FIG. 1 is a block diagram depicting a digital IF processing block in accordance with an embodiment of the present invention.

Referring now to the figures and in particular to FIG. 1, a digital IF processing block 10 of a RF receiver in accordance with an embodiment of the present invention is depicted in a block diagram. An analog-to-digital converter 11 (ADC) receives an output of an RF downconverter and quadrature I and Q components are separated by mixers 18 by mixing the sampled downconverter output with the output of a carrier source 16 which is generated by a closed loop comprising detection circuit 14 and IF carrier generator/summer 15. The outputs of mixers 18 are filtered and decimated by a novel digital decimation filter 12 in accordance with an embodiment of the present invention. Digital decimation filter 12 can be implemented in a digital application specific integrated circuit (ASIC), field programmable gate array (FPGA) or may include a processor and memory forming a digital signal processing block. It should be noted that various advantages of the present invention will enable digital signal processing without requiring a special-purpose digital signal processor (DSP), as requirements for a fast multiply instruction are eliminated for some embodiments. It should also be noted that the present invention provides new digital filter topologies and while a processor implementation may not be suitable in many IF receiver applications due to the processing rates required, the filter as implemented by a processor system executing program instructions in accordance with an embodiment of the present invention may be advantageous in other systems and circuit applications where a digital decimation filter is desirable.

Digital decimation filter 12 provides demodulated signal information selected from an IF passband within the output of ADC 11 and is capable of processing information from not only the first Nyquist band, but with proper external filtering may also process higher order Nyquist bands from the output of ADC 11. The IF passband outputs of digital decimation filter 12 is provided to an I and Q matched filter pair/symbol detector block 13 that generates the data (symbol decode) output of IF receiver block 10. A processor interface 17 provides an external control port, whereby programming (digital state selection) of various of the internal blocks of IF receiver block 10, such as IF carrier frequency, phase adjustment, etc. Of particular interest with respect to the present invention is that processor interface 17 permits programming of the output rate of digital decimation filter 12, which determines the maximum symbol rate entering matched filter pair/symbol detector block 13. The gain of digital decimation filter 12 is concurrently programmed by processor interface 17, as for maximal system dynamic range, the gain of the filter must be made inversely proportional to the square root of the filter bandwidth. The above-mentioned proportionality scales the energy of the filtered signal to remain constant as bandwidth is adjusted, providing a properly scaled signal to matched filter pair/symbol detector block 13. Processor interface 17 may also be used to program tap characteristics of digital decimation filter 12, although for most IF receiver applications, a fixed tap characteristic will be used.

Figure 2A:
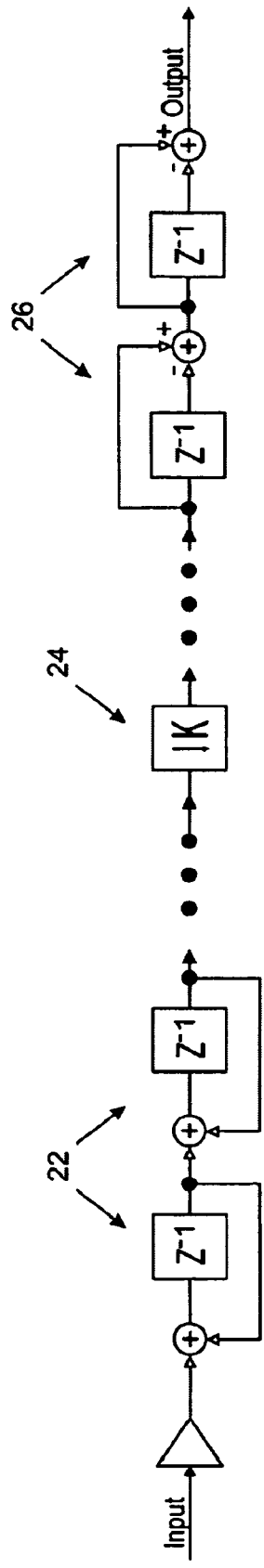
FIG. 2A is a block diagram depicting a prior art Hogenauer digital filter.

Referring now to FIG. 2A, a prior art Hogenauer digital decimation filter is depicted in a block diagram. Integrators 22 are cascaded to provide an integrator of order N. N integrators 22 are included before decimation block 24 to integrate the digital input. Since all of integrators 22 are inserted in the signal path prior to any decimation processing, the dynamic range of the integrators may be optimized for a particular application and input signal. After decimation block 24, N differentiators 26 are cascaded to provide the decimated final output signal. There are no feed-forward taps as in an FIR filter or feedback taps as in an infinite impulse response (IIR) filter, only the feedforward or feedback associated with each individual differentiator or integrator block. It is well known that a digital integrator as depicted may be expressed as a Z-transform implementation comprising a single delay element $Z^{-1}$ having a unity coefficient feedback signal summed with a unity coefficient input signal. It is also well known that a digital differentiator as depicted may be expressed as a Z-transform implementation comprising a single delay element $Z^{-1}$ having a unity coefficient output signal subtracted from a unity coefficient feed-forward of the input signal. The decimation factor of the depicted filter is k, and decimation block 24 sub-samples the output of integrators by the decimation factor to accomplish the bandwidth reduction.

The filter depicted in FIG. 2A is a filter for general use for providing digital decimation in IF receiver stages, but due to the shape of the filter transfer function (sinc function), a reasonably high order filter must typically be used (compared to that of analog filters), requiring a large number of integrator 22 and differentiator 26 stages. The large number of stages increases the integrator bit width and complexity. Since the zeros of the transfer function occur at 2/k multiples of the decimated output frequency, the relationship between the zeros is predetermined and yields the characteristic transfer function of the Hogenauer filter, which approaches a sinc function as k increases.

A primary advantage of the Hogenauer filter is that the passband shape is almost independent of decimation ratio, i.e., when the decimation ratio is changed, it is only necessary to change the scaling factor of decimation block 24 to shift the transfer function to the new decimation rate. Another desirable property of the Hogenauer filter is that overflow in the integrator stages due to DC offset does not generate distortion in the filter output. The present invention provides a new topology for a digital filter that provides control of the transfer function, while preserving the desirable characteristics of the Hogenauer filter.

Figure 2B:
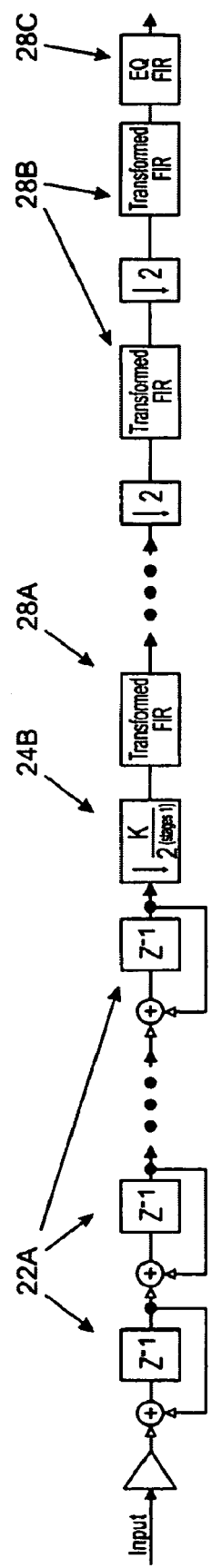
FIG. 2B is a block diagram depicting a digital decimating filter in accordance with an embodiment of the present invention.

Referring now to FIG. 2B, a digital decimating filter in accordance with an embodiment of the present invention is shown. Integrators 22A are present and arranged as in the Hogenauer filter topology, but the differentiator stages of the Hogenauer filter are replaced with transformed FIR filter sections 28A–28B, providing tunability of the transfer function zeros. Between each FIR filter section 28A–28B (which may include any number of filter sections), a decimation block 24C that sub-samples by two is inserted. An intermediate decimation block 24B scales the output rate by $k/2^{(N-1)}$ where k is the overall desired decimation ratio and N is the number of integrators and FIR sections.

The decimation portion of the filter (28A–B) is followed by a simple FIR filter 28C which is only required to equalize out the droop in the decimated pass band, not provide any attenuation. This reduces the speed requirement, as the FIR equalizer must only run at the decimated output rate and not faster. The FIR taps of FIR filter 28C are chosen so as to complement the attenuation of the other FIR stages 28A–B, so that the entire cascade structure provides all of the attenuation necessary to accomplish the stopband portion of the overall decimation filter.

Figure 3A:
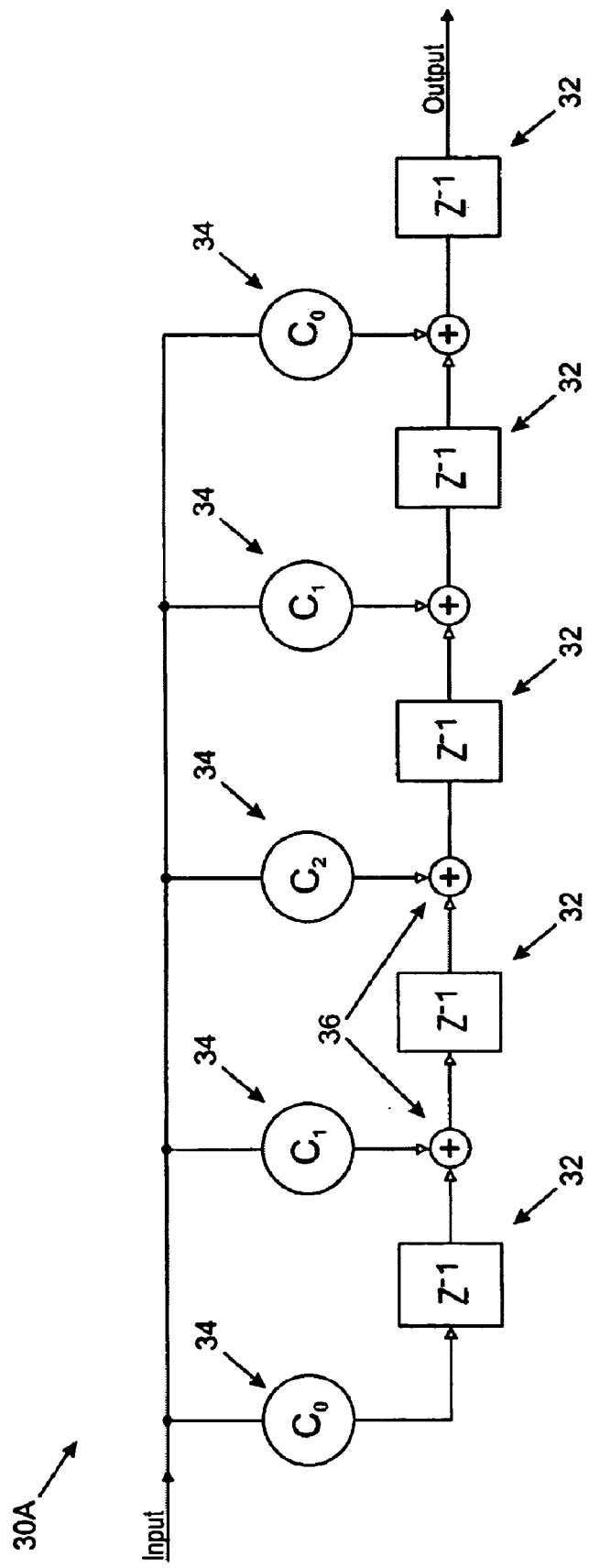
FIG. 3A is a block diagram depicting a prior art FIR filter section.

Referring now to FIG. 3A, detail of a prior art FIR filter section is depicted as is generally implemented in digital filter topologies. Coefficient multipliers 34 provide feedforward taps permitting placement of zeros of the transfer function that can provide control of rejection slope and passband ripple or droop. Summing nodes 36 sum the feedforward signals multiplied by coefficient multipliers 34 with the in-line filter signal propagating through delay stages 32. However, FIR filter section 30A is not suitable for use within the digital decimating filter of FIG. 2B. Because the FIR filter sections within the digital decimating filter of FIG. 2B must replace the differentiators of the Hogenauer topology, the filter of FIG. 3A must be transformed.

Figure 3B:
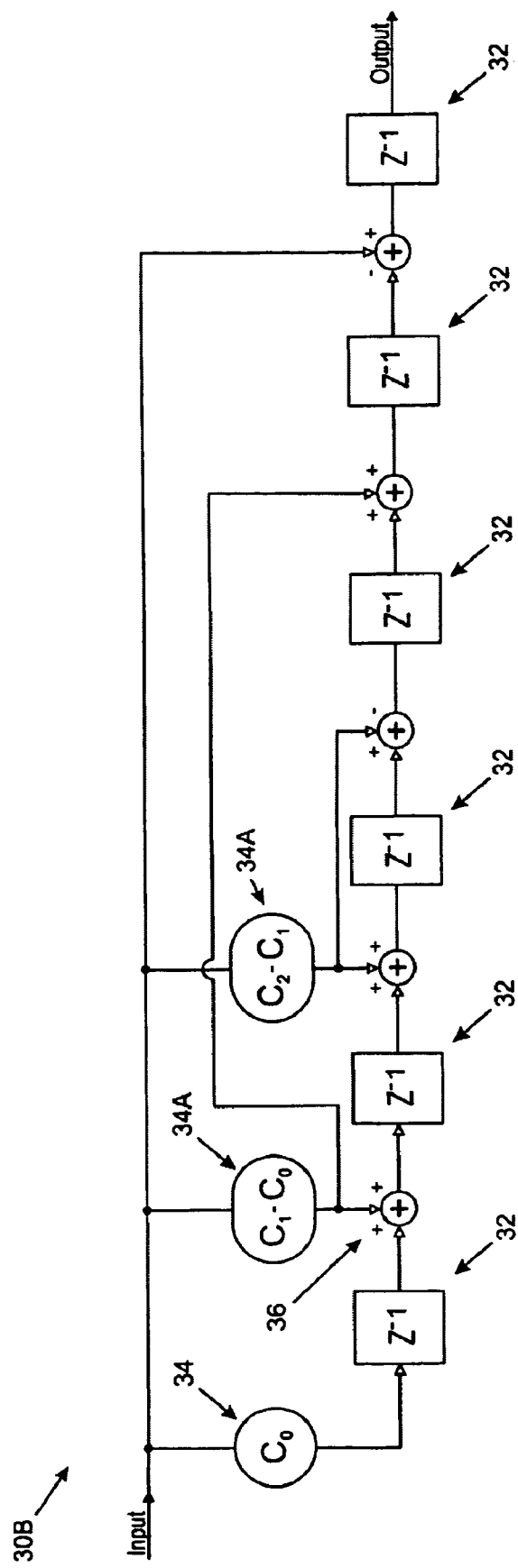
FIG. 3B is a block diagram depicting a transformed FIR filter module as incorporated within the digital decimating filter of FIG. 2B.

Referring now to FIG. 3B, a transformed FIR filter section is shown, which is preferred for implementing FIR filter sections 28A–C within digital decimation filter of FIG. 2B. Given a desired transfer function in the Z domain, a Z transform and a set of coefficients can describe a transfer function as follows (the first 3 taps are expressly shown):

$$H_{Desired}(Z) = (C_0 + C_1 \times Z^{-1} + C_2 \times Z^{-2} + C_3 \times Z^{-3} \ldots)$$

The Z transform of a digital integrator in a Hogenauer filter is shown below:

$$H_{integrator}(Z) = \frac{1}{(1 - Z^{-1})}$$

With a digital integrator preceding the FIR filter section, the filter needs to be transformed as follows:

$$H_{transform}(Z) = (1-Z^{-1}) \times (C_0 + C_1 \times Z^{-1} + C_2 \times Z^{-2} + C_3 \times Z^{-3} \ldots)$$

Which expands to the following result:

$$H_{transform}(Z) = C_0 + (C_1-C_0) \times Z^{-1} + (C_2-C_1) \times Z^{-2} + (C_3-C_2) \times Z^{-3} + (C_4-C_3) \times Z^{-4} \ldots$$

Therefore, in order to replace a differentiator stage with a FIR filter section, the prototype filter length is increased by 1 stage and the coefficients must be transformed to be the difference between the coefficient values of the original FIR filter. The above transform can be used to design decimator filters from a conventional prototype FIR filter.

The differentiators of the Hogenauer filter topology are each replaced with a FIR filter section, which is generally implemented as depicted as FIR filter section 30B. Coefficient multiplier/subtractors 34A are implemented with integer coefficients to preserve the desirable integrator overflow properties of a Hogenauer topology, and provide feedforward taps permitting placement of zeros of the transfer function that can provide control of rejection slope and passband ripple or droop. Summing nodes 36 sum the feedforward signals multiplied by coefficient multiplier/subtractors 34A with the in-line filter signal propagating through delay stages 32. Coefficient multiplier/subtractors 34A may be implemented using shifters and/or adders, as all coefficients are integer, eliminating any need for a fast multiplier. Delay stages 32 are generally operated at clock frequencies decreasing by factors of two for each transformed filter stage, as the progressive decimation through the filter permits reduction of the clock frequency. Depending on the topology, a single high frequency clock may be used (or a multiphase clock to permit compensation for on-chip delay and elimination of race conditions) and delay stages 32 enabled/disabled for clocked operation based on an enable signal progressively divided by two. It is advantageous in some applications to clock the first two stages of the first FIR filter section using the highest speed clock, in which case the filter taps must be transformed to take into account the frequency response change.

It is possible to design filters using the topology of FIG. 3B with arbitrary coefficient values, but a practical filter needs an additional restriction. A useful feature of the prior art structure is that with proper scaling the transfer characteristic of the decimation filter is independent of overflow in the integrator stages. The presence of a significant DC component at the input of the filter will eventually cause integrator overflow, and if the output is to be filtered without distortion, the result must be independent of the issue. This desirable property of independence is preserved in the invention herein described by requiring the transformed FIR taps to have integer values.

An illustration of a filter design showing the relationship between the desired FIR filter design and the coefficients as transformed for use in the digital decimation filter of the present invention is illustrated in Table 1:

TABLE 1

| Filter | # of Taps | FIR TAP Values | Transformed Tap Values |
|---|---|---|---|
| 1 | 3 | 2, 3, 2 | 2, 1, −1, −2 |
| 2 | 5 | 2, 5, 7, 5, 2 | 2, 3, 2, −2, −3, −2 |
| 3 | 1 | 1 | 1, −1 |

Figure 4:
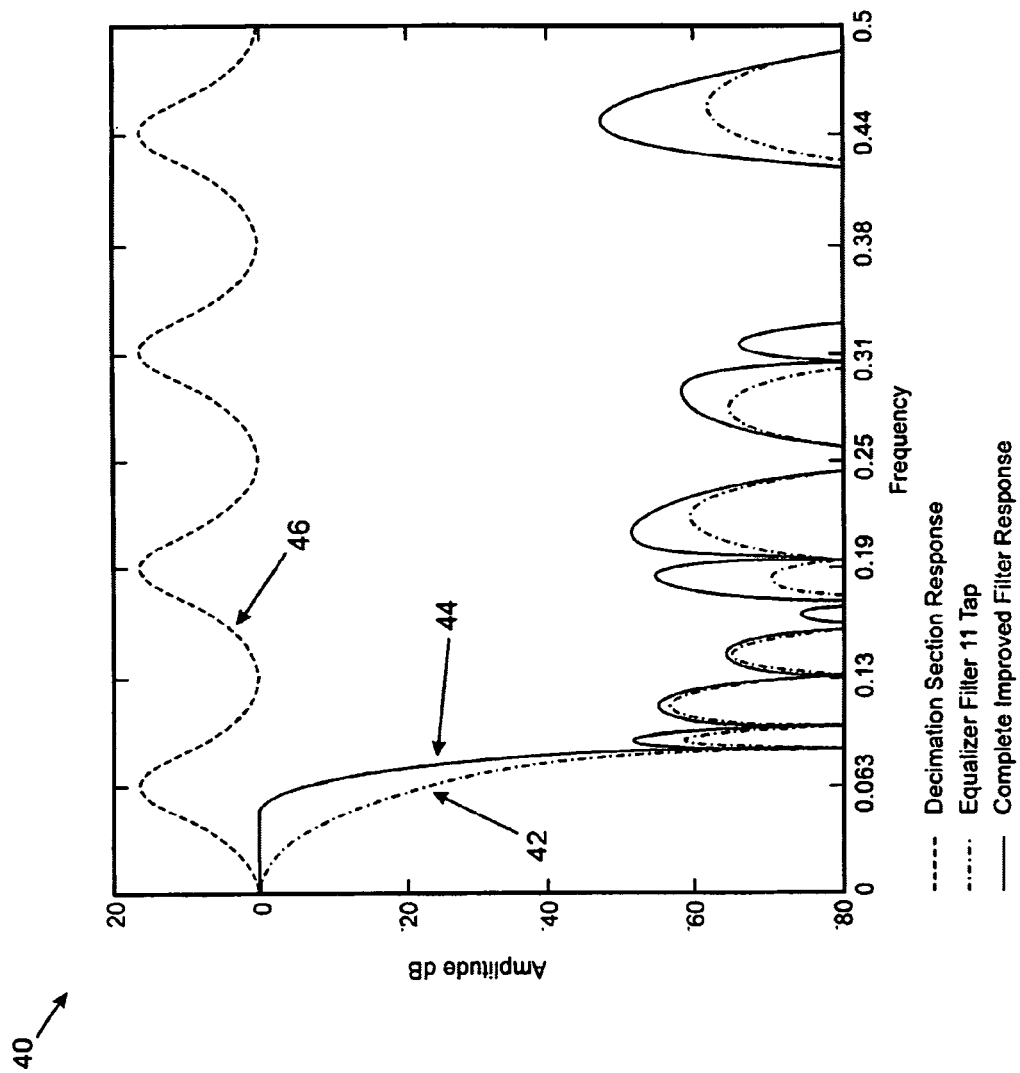
FIG. 4 is a graph depicting frequency response characteristics within a digital filter in accordance with an embodiment of the present invention.

Note that Filter section 3 is a standard Hogenauer differentiator stage. A filter with the coefficients of Table 1 was built as part of sampled IF receiver and set for post processing at 8 bit word width, requiring roughly 50 dB of attenuation in the decimation filter. The filter was built to requirements using 3 stages (N=3) of the modified Hogenauer filter for the decimation section. The decimation section was built using only coefficient values of 1, 2 and 3 which minimizes the number of adders required to generate the coefficients. The frequency response 42 of the above-described filter is shown in FIG. 4.

The decimation section was followed by a conventional 11 Tap FIR filter to equalize (remove) the passband droop. The filter is odd order and symmetrical with 6 unique coefficient values. The coefficients of the equalizer filter are:

| Coefficient Number | Coefficient Value |
|---|---|
| Coefficient 0 and 10 | −1/128 −1/512 |
| Coefficient 1 and 9 | 1/16 −1/64 |
| Coefficient 2 and 8 | −1/8 −1/64 −1/256 |
| Coefficient 3 and 7 | −1/2 −1/8 |
| Coefficient 4 and 6 | −1 −1/8 −1/64 |
| Coefficient 5 | 2 + (if k = 4 then 1/32 else 0) |

The overall filter has passband flatness within +−0.1 dB from 0 to 0.35 of the decimated rate, and a stopband of −47 dB at the worst case (typically >−50 dB) from 0.65 to 1 times the decimated rate, forming an effective decimator. These specifications are met at decimation ratios of $2^J$ where J ranges from 2 to 13, or overall decimation in powers of 2 from 4 to 8192. The frequency response 44 of the overall digital decimating filter is shown in FIG. 4. The response 46 of the equalizer FIR filter is also shown in FIG. 4.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A digital IF processing block for processing an intermediate frequency signal within a communications receiver, comprising:
    a digital filter having an input coupled to said intermediate frequency signal, said digital filter comprising
        a plurality of cascaded integrator stages coupled to an input of said digital filter circuit, and
        a plurality of cascaded finite impulse response (FIR) filter stages, wherein a first one of said FIR filter stages has an input coupled to an output of a last one of said integrator stages; and
    a data processor comprising
        at least one matched filter coupled to said output of said last one of said FIR filter stages for correlating symbol energy encoded within said intermediate frequency signal, and
        at least one detector coupled to an output of said at least one matched filter for providing a digital data output of said digital IF processing block.

2. The digital IF processing block of claim 1, further comprising one or more programming registers for receiving external select information, and wherein said programming registers are coupled to said digital filter for selecting a bandwidth of said digital filter by adjusting a decimation rate of at least one of said plurality of FIR filter stages.

3. The digital IF processing block of claim 1, wherein a transfer function from said input of said digital filter to an output of a last one of said FIR filter stages has a finite DC gain and a frequency domain shaping characteristic, and wherein an output of said last FIR filter stage is decimated substantially with respect to said output of said last integrator.

4. The digital IF processing block of claim 1, wherein said digital filter further comprises a plurality of decimate-by-two blocks, each disposed between a pair of said plurality of FIR stages, whereby each of said plurality of FIR filter stages operates at a rate decimated by two with respect to a preceding one of said plurality of FIR filter stages, excepting a first one of said plurality of FIR filter stages.

5. The digital IF processing block of claim 1, wherein said FIR filter stages are transformed stages having tap coefficients determined by differences between pairs of sequential coefficients of the Z-transform of a predetermined FIR filter stage transfer function, whereby said FIR filter stages are transformed to operate on an integrated signal to produce said FIR filter stage transfer function.

6. The digital IF processing block of claim 5, wherein each of said FIR filter stages includes a number of delay elements coupled in sequence equal to the order of said FIR filter stage transfer function plus one.

7. The digital IF processing block of claim 1, further comprising a decimation block having a decimation factor equal to the overall desired decimation factor of said plurality of FIR filter stages divided by two raised to a power equal to a quantity of said plurality of FIR filter stages.

8. The digital IF processing block of claim 7, wherein said digital filter further comprises a plurality of decimate-by-two blocks, each disposed between a pair of said plurality FIR stages, whereby each of said plurality of FIR filter stages operates at a rate decimated by two with respect to a preceding one of said plurality of FIR filter stages, excepting a first one of said plurality of FIR filter stages.

9. The digital IF processing block of claim 8, wherein FIR filter stages are transformed stages having tap coefficients determined by differences between pairs of sequential coefficients of the Z-transform of a predetermined FIR filter stage transfer function, whereby said FIR filter stages are transformed to operate on an integrated signal to produce said FIR filter stage transfer function, and wherein each of said FIR filter stages includes a number of delay elements coupled in sequence equal to the order of said FIR filter stage transfer function plus one.

10. The digital IF processing block of claim 9, further comprising an equalizer filter having a frequency response substantially equal to an inverse of a Nyquist passband droop of said plurality of FIR filter sections.

11. The digital IF processing block of claim 1, further comprising an equalizer filter having a frequency response substantially equal to an inverse of a Nyquist passband droop of said plurality of FIR filter sections.

12. The digital IF processing block of claim 1, further comprising a digital mixer having an output coupled to said input of said digital filter for providing said intermediate frequency signal.

13. A digital IF processing block for processing an intermediate frequency signal within a communications receiver, comprising:
   a digital mixer having an output for providing an intermediate frequency signal;
   a digital filter having an input coupled to said output of said digital mixer, said digital filter comprising
      a plurality of cascaded integrator stages coupled to an input of said digital filter circuit, and
      a plurality of cascaded finite impulse response (FIR) filter stages, wherein a first one of said FIR filter stages has an input coupled to an output of a last one of said integrator stages;
   a data processor comprising
      at least one matched filter coupled to said output of said last one of said FIR filter stages for correlating symbol energy encoded within said intermediate frequency signal, and
      at least one detector coupled to an output of said at least one matched filter for providing a digital data output of said digital IF processing block; and
   an equalizer filter having an input coupled to an output of said digital filter and having a frequency response substantially equal to an inverse of a Nyquist passband droop of said plurality of FIR filter sections.

* * * * *